United States Patent [19]

Fleischer

[11] 4,438,356

[45] Mar. 20, 1984

[54] SOLID STATE RELAY CIRCUIT EMPLOYING MOSFET POWER SWITCHING DEVICES

[75] Inventor: Kenneth H. Fleischer, Los Angeles, Calif.

[73] Assignee: International Rectifier Corporation, Los Angeles, Calif.

[21] Appl. No.: 361,184

[22] Filed: Mar. 24, 1982

[51] Int. Cl.³ .......................................... H03K 17/687
[52] U.S. Cl. .................................... 307/571; 307/577; 307/598; 307/584
[58] Field of Search ............... 307/571, 572, 573, 577, 307/279, 581, 598, 584

[56] References Cited

U.S. PATENT DOCUMENTS

| | | | |
|---|---|---|---|
| 3,471,719 | 10/1969 | Hughes | 307/572 |
| 3,740,744 | 6/1973 | Nakada et al. | 307/571 |
| 4,052,623 | 10/1977 | Loberg | 307/571 |
| 4,316,243 | 2/1982 | Archer | 307/584 |

*Primary Examiner*—Stanley D. Miller
*Assistant Examiner*—B. P. Davis
*Attorney, Agent, or Firm*—Ostrolenk, Faber, Gerb & Soffen

[57] ABSTRACT

A solid state relay employing MOSFET power switching devices is disclosed. A d-c output relay is disclosed using a single power MOSFET device and an a-c output relay is disclosed employing series opposition power MOSFETS.

18 Claims, 2 Drawing Figures

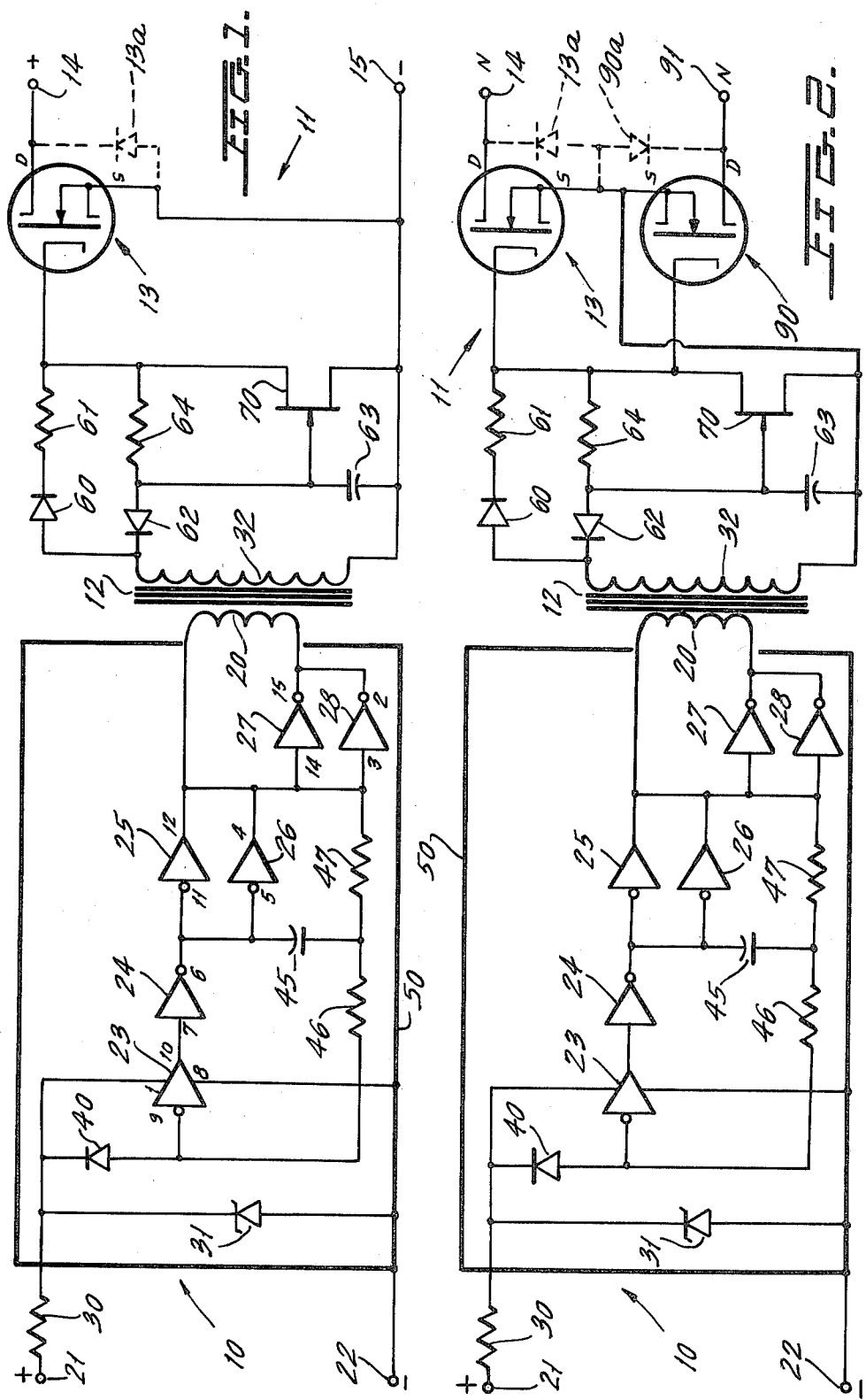

SOLID STATE RELAY CIRCUIT EMPLOYING MOSFET POWER SWITCHING DEVICES

BACKGROUND OF THE INVENTION

This invention relates to a solid state relay, and more particularly relates to a novel solid state relay which employs a power MOSFET in the output circuit.

Solid state relays are well known in the art and conventionally employ bipolar semiconductor devices such as thyristors, triacs or power transistors as the power switching element. The use of bipolar switching devices as the output power element of the relay makes it possible to derive control power for the relay from the output circuit when the powwer bipolar devices are conducting. Power MOSFET devices have not been easily utilized in solid state relay circuits because it is difficult to derive control power from the output circuit after the device is switched on. Also, present a-c solid state relay circuits using bipolar devices necessarily produce substantial electromagnetic interferences. Present d-c solid state relay circuits using bipolar devices which derive their power for the relay from the output circuit necessarily have relatively large voltage across the output terminals when turned on, even for relatively small output currents. Also the off switching of the d-c relay is relatively slow.

BRIEF DESCRIPTION OF THE INVENTION

In accordance with the invention, a circuit is provided which permits the use of MOSFET power devices as the main conductive elements of the solid state relay circuit. Preferably the power MOSFET selected for use in the circuit is the HEXFET MOSFET manufactured by the International Rectifier Corporation of El Segundo, Calif. More particularly, and in accordance with the invention, an input circuit is provided which is essentially a low power oscillator circuit which produces a high frequency output in response to the presence of a small input switching signal. A coupling transformer then couples the output of the oscillator to the control circuit for the power MOSFET, where the control circuit employs a first connection to the power MOSFET gate operable to charge the MOSFET gate capacitance to turn it on. A second connection is provided in parallel with the power MOSFET gate which includes a control transistor which is normally conductive and thus normally disables the gate of the power MOSFET. The control transistor has a capacitor connected to or associated with its gating circuit, which capacitor will be charged upon the appearance of an input signal to the control circuit so that the control transistor turns off and permits the charging of the MOSFET capacitor to turn on the MOSFET within a relatively few cycles of the input frequency. If the control transistor has a high enough gate capacitance, an added discrete control capacitor is not needed. Hereinafter, the control capacitor for the control transistor includes the control transistor gate capacitance plus the capacitance of any discrete element which may be added to the control transistor gate circuit. When the input signal is discontinued, the capacitance of the MOSFET is coupled to the control capacitor of the control transistor and causes the control transistor to turn on, thus discharging the MOSFET gate capacitance and forcing off the MOSFET very quickly. The MOSFET circuit can have a d-c output connected to the main MOSFET terminals and, with the addition of a second MOSFET, the circuit can also be used for a-c output.

The novel circuit of the invention does not require taking power from across the power MOSFET in order to keep the power MOSFET turned on. Moreover, even though the power MOSFET, being a highly capacitive device, is easy to turn on, it is relatively difficult to turn off. The novel circuit of the invention makes it possible to easily take charge out of the power MOSFET gate in order to turn the power MOSFET off.

In the two-MOSFET version of the device, the output circuit is almost purely resistive and, with the exception of turn-on transients, will produce no electromagnetic radiation interference except for that low power radiation which might be produced by the low power control oscillator. The EMI from the control oscillator is negligible in comparison to that of prior art arrangements of solid state relays employing bipolar power devices.

BRIEF DESCRIPTION OF THE DRAWINGS

FIG. 1 is a circuit diagram of a circuit employing the concept of the present invention wherein a single MOSFET is used for a d-c to d-c relay.

FIG. 2 is similar to FIG. 1 but shows a second MOSFET in series opposition with the first output stage to convert the relay to a d-c to a-c relay.

DETAILED DESCRIPTION OF THE DRAWINGS

Referring first to FIG. 1, the circuit employs an input oscillator 10, a control circuit 11 connected to the input oscillator by the ferrite transformer 12 and a power MOSFET output 13. For a relay rating of 100 volts d-c at 7 amperes d-c at d-c terminals 14 and 15, the power MOSFET 13 preferably is an n-channel HEXFET MOSFET type IRF530 manufactured by International Rectifier Corporation. Device 13 has an inherent parallel diode 13a, shown in dotted lines as diode 13a. The MOSFET device 13 conducts current in the blocking direction upon the appearance of a gate voltage on its gate to permit conventional current conduction from terminal 14 to terminal 15. The drain and source terminals of device 13 are marked "D" and "S" respectively.

Any desired type of oscillator circuit can be employed for the oscillator 10. A preferred oscillator converts a signal input voltage between 3.5 and 20 volts d-c on signal input terminals 21 and 22 to a 100 kilohertz square wave voltage on the primary winding 20 of the ferrite transformer 12. Clearly, other input voltages and other frequencies could be employed. The input source is generally a low voltage, low power switching signal which varies between on and off switching values. The power of the switching signal however provides the necessary power to operate the relay and keep it closed after closing.

The oscillator 10 which is illustrated is a three-gate oscillator, does not employ capacitive elements which would slow down the turn-on or turn-off of the circuit. The oscillator shown will begin oscillate when the input voltage at terminals 21 and 22 reaches about 2 volts d-c. Oscillator 10 employs a CMOS hex inverter which may be of the type CD4049UBE and includes the six inverter elements 23 to 28 which have pins which are numbered as shown in FIG. 1.

The input to the oscillator 10 includes resistor 30 and zener diode 31, the series combination of which is connected across the terminals 21 and 22. Zener diode 31 clamps the input voltage to approximately 4.5 volts, thereby limiting the voltage which ultimately is produced on the secondary winding 32 of transformer 10 to less than about 18 volts. Note that, by limiting the voltage in the input circuit by the zener diode 31, no input power is wasted when the input voltage is less than the clamp voltage. This is of importance since the relay will be held on by only the very small energy which can be derived from the low power input circuit.

A diode 40 is connected to resistor 30 and zener 31 as shown and serves the purpose of correcting the duty cycle of the oscillator 10 to approximately a 50% duty cycle. The anode of diode 40 is connected to the input of inverter 23 and the output of inverter section 23 is connected to inverter section 24 which is, in turn, connected to the parallel-connected inverter sections 25 and 26. Sections 25 and 26 are connected in parallel to increase their power capability.

The output of inverter sections 25 and 26 is then connected as shown to the input of inverter sections 27 and 28 and to one side the primary winding 20. The outputs of inverter sections 27 and 28 are paralleled to increase their power capability and are connected to the other side of primary winding 20. A conventional timing network consisting of capacitor 45 and resistors 46 and 47 controls the timing of the oscillator output.

The oscillator circuit 10 is preferably enclosed by a suitable conventional conductive guard which is shown by a heavy line 50.

Transformer 12 may be formed of a wire having gauge AWG40 wound on a ferrite core. In a transformer which was used, the primary winding 20 and 75 turns and the secondary winding 32 had 300 turns. As stated previously, the oscillator circuit 10 applies a square pulse on the primary winding 20 at a frequency of 100 kilohertz. The output voltage appearing across the secondary winding 32 will be less than about 18 volts a-c at 100 kilohertz.

The output of secondary winding 32 drives the control circuit 11. Thus, the upper terminal of secondary winding 32 is connected to the gate of the MOSFET 13 through diode 60 and current-limiting resistor 61. Another current path proceeds from the upper terminal of winding 32 through the diode 62 to capacitor 63 and from diode 62 through the resistor 64 which is also connected to the gate of the MOSFET 13. A control transistor 70 controls the discharge of the gate capacitance of MOSFET 13. Transistor 70 is a J-FET transistor and has its gate electrode connected to the top of capacitor 63 and its drain and source electrodes connected between the gate of MOSFET 13 and terminal 15. The operation of the circuit of FIG. 1 is as follows:

In order to turn on the MOSFET 13 and thus "close" the relay between terminals 14 and 15, a control voltage is applied to terminals 21 and 22 of oscillator 10. Oscillator 10 turns on and a high frequency output appears across secondary winding 32 of transformer 12. On the first negative half cycle, capacitor 63 is charged through diode 62 which ensures that capacitor 63 will be charged negatively (at its top terminal in FIG. 1). By negatively charging capacitor 63 at its top, the transistor 70 is biased off. Consequently, on the next positive half cycle at winding 32, forward current through diode 60, limited by the resistance of resistor 61 will charge the gate capacitance of MOSFET 13. Note that transistor 70 is biased off so long as capacitor 63 is charged negatively, so that the gate capacitance of the MOSFET 13 can be continuously charged. As the gate capacitance of MOSFET 13 begins to charge, the main device begins to turn on to create a closed current path between terminals 14 and 15 which has low resistance. The MOSFET transistor 13 will be fully on in approximately 2 or 3 cycles of the voltage at second winding 32. Very little input power, well within the power normally available at control terminals 21 and 22 is required to keep the MOSFET 13 turned on and the relay will stay on without the need for deriving power from the main output circuit.

In order to turn off the MOSFET 13, it is necessary to take charge out of the gate capacitance of the device. In accordance with the present invention, in order to turn the device off, the input at terminals 21 and 22 is reduced to a low enough value or is removed to stop the oscillator 10. This turns off the control power at the secondary winding 32. Thus the relatively large gate capacitance of MOSFET 13 is now connected to a discharge path including resistor 64 and contact capacitor 63. The potential of capacitor 63 at the point where it is connected to the gate of transistor 70 then rises positively past the threshold point of transistor 70 and turns on the transistor 70. The turn on of transistor 70 then forces off the MOSFET 13 very quickly and "opens" the relay between d-c power terminals 14 and 15.

Consequently, and in accordance with the invention, a novel circuit is provided which permits the use of a MOSFET switching device as the power element of a solid state relay. Moreover, the circuit is extremely simple in construction and has a minimum number of components.

The novel circuit configuration of FIG. 1 was successfully implemented using components stated above, along with other components identified in the following Table I:

TABLE I

| Resistors | |
|---|---|
| 30 | 620 ohms |
| 46 | 10 kilo ohms |
| 47 | 100 kilo ohms |
| 61 | 2.2 kilo ohms |
| 64 | 10 meg ohms |
| Capacitors | |
| 45 | 50 picofarads |
| 63 | 20 picofarads |
| Semiconductor Devices | |
| MOSFET 13 | HEXFET IRF530 |
| Zener 31 IN749A | |
| Diode 40 | IN4148 |
| Diode 60 | IN4148 |
| Diode 62 | IN4148 |
| Transistor 70 | 10967 |

The same basic circuit as that shown in FIG. 1 can be used for a wide range of voltage and current ratings simply by modifying the type of device used for MOSFET 13 or by connecting a plurality of such devices in parallel. Table II, which follows, shows the rated d-c voltage and current of eight different relays which employ different ratings for the MOSFET used or different circuit arrangements of MOSFET devices in place of the MOSFET 13. Thus, for the first four circuits in Table I, three MOSFET devices of the designated type are connected in parallel in place of the single MOSFET 13 shown in FIG. 1. It will be seen in Table II that a relatively modest voltage drop is created between terminals 14 and 15 for the various circuits.

TABLE II

| OUTPUT RATING | | MOSFET | VOLTAGE DROP BETWEEN TERMINALS (14) & (15) @ MAX AMPS |
|---|---|---|---|
| VOLTAGE (Volts) | Current (Amps d-c) | DEVICE (13) | (CALCULATED) |
| 100 | 20 | (3)-IRF530 | 1.2 |
| 200 | 12 | (3)-IRF630 | 1.6 |
| 400 | 7 | (3)-IRF730 | 2.3 |
| 500 | 6 | (3)-IRF830 | 3.0 |
| 100 | 7 | (1)-IRF530 | 1.3 |
| 200 | 4 | (1)-IRF630 | 1.6 |
| 400 | 2 | (1)-IRF730 | 2.0 |
| 500 | 1.5 | (1)-IRF830 | 2.3 |

The circuit of FIG. 2 shows the manner in which the circuit of FIG. 1 can be modified so that the relay can be connected to control an a-c power circuit.

The circuit of FIG. 2 differs from that of FIG. 1 only in that a second MOSFET 90 is connected in series opposition with the MOSFET 13. The drain electrode of MOSFET 90 is connected to a-c terminal 91 which replaces terminal 15 of FIG. 1 while the drain of MOSFET 13 remains connected to terminal 14. The gate of MOSFET 90 is also connected to control transistor 70 and to the gate of MOSFET 13.

The inherent diode 90a of the HEXFET MOSFET 90 has an opposite polarity to that of inherent diode 13a of MOSFET 13. Therefore, depending on polarity of the voltage at terminals 14 and 91, when a gate signal turns on the MOSFETS 13 and 90 for conduction in their blocking direction, power a-c current flow will occur between terminals 14 and 91 and through one of MOSFETS 13 and 90 and the forward biased, inherent diode of the other. Note that when the MOSFETS 13 and 90 are off, current flow between terminals 14 and 91 is prevented by the opposing inherent diodes 13a and 90a. Note also that the impedance of the relay when conducting is almost purely resistive and there is virtually no EMI from the relay except for the negligible EMI from the low power oscillator 10.

Although the present invention has been described in connection with a preferred embodiment thereof, many variations and modifications will now become apparent to those skilled in the art. It is preferred therefore, that the present invention be limited not by the specific disclosure herein, but only by the appended claims.

What is claimed is:

1. A solid state relay employing a MOSFET device as its power switching element; said solid state relay comprising an input circuit for receiving low voltage, low power input switching signals which vary between an on value and an off value; an oscillator circuit connected to said input circuit for producing a relatively high frequency output in response to said on value switching signal; a control circuit for applying and removing gate voltage to said MOSFET device and coupling means for coupling said control circuit to said high frequency output; said control circuit including control transistor means connected to the gate of said MOSFET device and operable to discharge the gate capacitance of said MOSFET device when said control transistor means is conductive; capacitance means coupled between the gate of said control transistor means and said coupling means for rendering said control transistor means nonconductive in the presence of an output from said coupling means; and circuit means including a diode directly connecting the output of said coupling means to the gate of said MOSFET device and to said control transistor means, whereby said circuit means including said diode can cause charging of the gate capacitance of said MOSFET device only when said control transistor is nonconductive.

2. The relay of claim 1, wherein said coupling means is a transformer.

3. The relay of claim 1, wherein said oscillator circuit is a three-gate oscillator having an output frequency of the order of 100 kilohertz.

4. The relay of claim 1, wherein said switching signals comprise d-c voltage signals which cause switching of said relay for changes in input voltages within a range of less than about 20 volts.

5. The relay of claim 1, wherein said MOSFET device includes a plurality of parallel connected MOSFET device units.

6. The relay of claim 1, wherein said control transistor means has drain and source electrodes connected between the gate and a main electrode respectively of said MOSFET device, and wherein said capacitance means includes the total capacitance between the gate and the source electrodes of said control transistor means.

7. The relay of claim 6, wherein a circuit including said diode and said coupling means is connected to said gate of said control transistor means, whereby said capacitance means is charged through said diode in a direction to turn off said control transistor means when an a-c output appears at said coupling means.

8. The relay of claim 7, which further includes high resistance means connected between said gate of said MOSFET device and said gate of said control transistor means for causing the gate capacitance of said MOSFET device to change the charge of said capacitance means in order to turn off said MOSFET device when the output of said coupling means turns off.

9. The relay of claim 8, wherein said coupling means is a ferrite core transformer.

10. The relay of claim 9, wherein said oscillator circuit is a three-gate oscillator having an output frequency of the order of 100 kilohertz.

11. The relay of claim 10, wherein said switching signals comprise d-c voltage signals which switch between two values in the range of less than about 20 volts.

12. The relay of claim 8 or 11, wherein said MOSFET device includes a plurality of parallel-connected MOSFET elements.

13. The relay of claims 1, 2, 3, 4, 5, 6, 7, 8, 9, 10 or 11, wherein said MOSFET device is a HEXFET MOSFET device which has an inherent diode in parallel with its source and drain electrodes.

14. The relay of claim 12, wherein said MOSFET device is a HEXFET MOSFET device which has an inherent diode in parallel with its source and drain electrodes.

15. The relay of claims 1, 2, 3, 4, 5, 6, 7, 8, 9, 10 or 11, wherein said MOSFET device includes first and second HEXFET MOSFET components connected in series opposition.

16. The relay of claim 12, wherein said MOSFET device includes first and second HEXFET MOSFET components connected in series opposition.

17. The relay of claim 13, wherein said MOSFET device includes first and second HEXFET MOSFET components connected in series opposition.

18. The relay of claim 14, wherein said MOSFET device includes first and second HEXFET MOSFET components connected in series opposition.

* * * * *